United States Patent
Chen et al.

(10) Patent No.: US 9,299,683 B2
(45) Date of Patent: Mar. 29, 2016

(54) ABUTMENT STRUCTURE OF SEMICONDUCTOR CELL

(71) Applicant: Jye-Yuan Lee, Taipei (TW)

(72) Inventors: Yi-Fon Chen, Nantou County (TW); Yu-Cheng Yang, Kaohsiung (TW); Jye-Yuan Lee, Taipei (TW)

(73) Assignee: GLOBAL UNICHIP CORPORATION, Hsinchu (TW)

( * ) Notice: Subject to any disclaimer, the term of this patent is extended or adjusted under 35 U.S.C. 154(b) by 295 days.

(21) Appl. No.: 13/675,540

(22) Filed: Nov. 13, 2012

(65) Prior Publication Data

US 2013/0134484 A1     May 30, 2013

Related U.S. Application Data

(63) Continuation of application No. 13/064,160, filed on Mar. 9, 2011, now Pat. No. 8,310,302.

(30) Foreign Application Priority Data

Aug. 30, 2010   (TW) ................................ 99129032 A

(51) Int. Cl.
| | |
|---|---|
| H01L 23/52 | (2006.01) |
| H01L 25/00 | (2006.01) |
| H01L 27/02 | (2006.01) |
| H01L 27/118 | (2006.01) |

(52) U.S. Cl.
CPC ............ *H01L 25/00* (2013.01); *H01L 27/0207* (2013.01); *H01L 27/11807* (2013.01); *H01L 2924/0002* (2013.01)

(58) Field of Classification Search
USPC .................................. 257/207; 327/565, 566
See application file for complete search history.

(56) References Cited

U.S. PATENT DOCUMENTS 7,508,256 B2 *  3/2009  Hillman et al. ................ 327/565

\* cited by examiner

*Primary Examiner* — Sibin Chen
(74) *Attorney, Agent, or Firm* — Bacon & Thomas, PLLC

(57) ABSTRACT

An abutment structure comprises a power rail, a ground rail parallel to the power rail, first cells and second cells. An area is defined between the power and the ground rails. A portion of each first and second cell overlaps the power and the ground rails, and another portion thereof is within the area. The first cells are within the abutment structure with original patterns thereof. The second cells respectively has an original pattern and a base pattern being a flip pattern of the original pattern, and are within the area with alternate of the original and the base patterns. The first and the second cells are within the area alternately without overlapping. Alternatively, the first and the second cells may also be within different areas, and the second cells are within different areas respectively with the base pattern and a flip pattern of the base pattern thereof.

6 Claims, 3 Drawing Sheets

ABUTMENT STRUCTURE OF SEMICONDUCTOR CELL

This application is a continuation application of pending U.S. patent application Ser. No. 13/064,160, filed Mar. 9, 2011, which claims benefit of Taiwan Application 099129032, filed on Aug. 30, 2010 (of which the entire disclosure of the pending, prior application is hereby incorporated by reference).

BACKGROUND OF THE INVENTION

1. Field of the Invention

The present invention generally relates to an abutment structure, and more particularly to an abutment structure of a semiconductor cell.

2. Description of the Prior Art

Conventional standard cell libraries in semiconductor integrated circuits (IC) primarily contain a logic cell layout based in a metal oxide semiconductor (MOS) environment, in particularly a complementary metal oxide semiconductor (CMOS) environment. A standard cell is a pre-designed layout of transistors or non-specific collection of logic gates that are typically interconnected or wired together in a particular manner to perform a specific type of logical operation in an application specific IC (ASIC). A conventional ASIC layout is typically defined by an array of logic cells arranged in adjacent rows. Such a row 10 is shown in FIG. 1 published from U.S. Pat. No. 7,266,787.

FIG. 1 shows a physical layout design of a row of cell structures within a CMOS environment. The adjacent logic cells 12, 31, 32, 33, are bound by a power rail 14 and a ground rail 16. Each logic cell defines a specific logic circuit. The active areas or components of the logic cell include negative-channel diffusion 24, positive-channel diffusion 26, and gate 34 layers. The components of the logic cells are wired internally with vias 28 and metal layer 18, 20, 22 to form simple logic (NMOS and PMOS) gates to perform Boolean and logic functions, for example INVERTER (or NOT), AND, OR, NAND, NOR, XOR, XNOR, ADDERS, FLIP-FLOP, and the like. In the design of the interconnection layout, IC design rules must be observed, for example, minimum width of transistor width, minimum width of metal tracks, and the like.

A very important function of the standard cell libraries is for satisfying various logic cell layouts. A single abutment may be able to pass a design rule check (DRC). However, abutments of different cells may be not likely to pass the DRC simultaneously. Thus, it is important to let various cell layouts pass the DRC by using cells in the standard cell libraries to rapidly generate different abutment combinations.

SUMMARY OF THE INVENTION

The present invention is directed to an abutment structure using original patterns of two different cells to be abutment cells, so as to form various abutments able to achieve the DRC.

According to an embodiment of the present invention, the abutment structure comprises a power rail, a ground rail parallel to the power rail, a plurality of first cells and a plurality of second cells. An area is defined between the power rail and the ground rail. A portion of each first cell is overlapping the power rail and the ground rail, and another portion thereof is located within the area, wherein each first cell has an original pattern. A portion of each second cell is overlapping the power rail and the ground rail, and another portion thereof is located within the area, wherein each second cell has an original pattern and a base pattern, and the base pattern is a flip pattern of the original pattern. The first cells and the second cells are disposed within the area alternately without overlapping, the first cells are disposed within the area with the original patterns of the first cells, and the second cells are disposed within the area with alternate of the original and the base patterns of the second cells.

According to another embodiment of the present invention, the abutment structure comprises a plurality of power rails, a plurality of ground rails, a plurality of first cells and a plurality of second cells. The ground rails are parallel to and alternating with the power rails, wherein an area is defined between any one of the power rails and one of the ground rails adjacent to that power rail. A portion of each first cell is overlapping one of the power rails and one of the ground rails adjacent to that power rail, and another portion thereof is located within one of the areas located between that power rail and that ground rail, wherein each first cell has an original pattern. The second cells are located within two of the areas adjacent to one of the areas disposed with the first cells, wherein each second cell has an original pattern, a base pattern being a flip pattern of the original pattern and an alternative pattern being a flip pattern of the base pattern, wherein some of the base patterns of the second cells are disposed to one of the two areas that the second cells located within, and the alternative patterns of the second cells are disposed to the other one of the two areas that the second cells located within.

In the present invention, a relationship between a location of any one of the first cells and locations of the second cells located within the areas adjacent to the first cell of an abutment structure is translation or center-alignment.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments.

Figure 1:
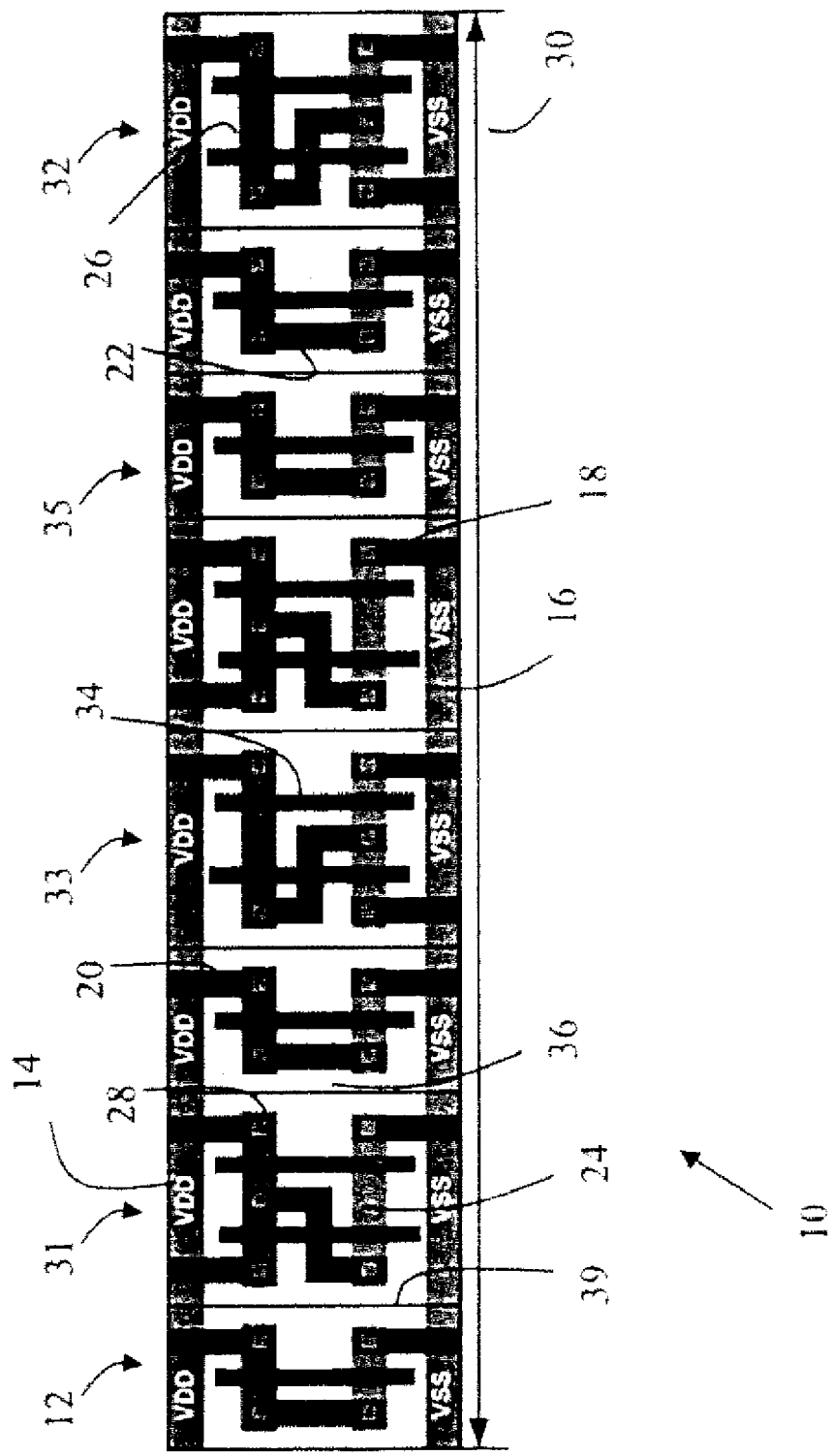
FIG. 1 shows a prior layout design of a row of cell structures within a CMOS environment.
Figures 2A, 2B:
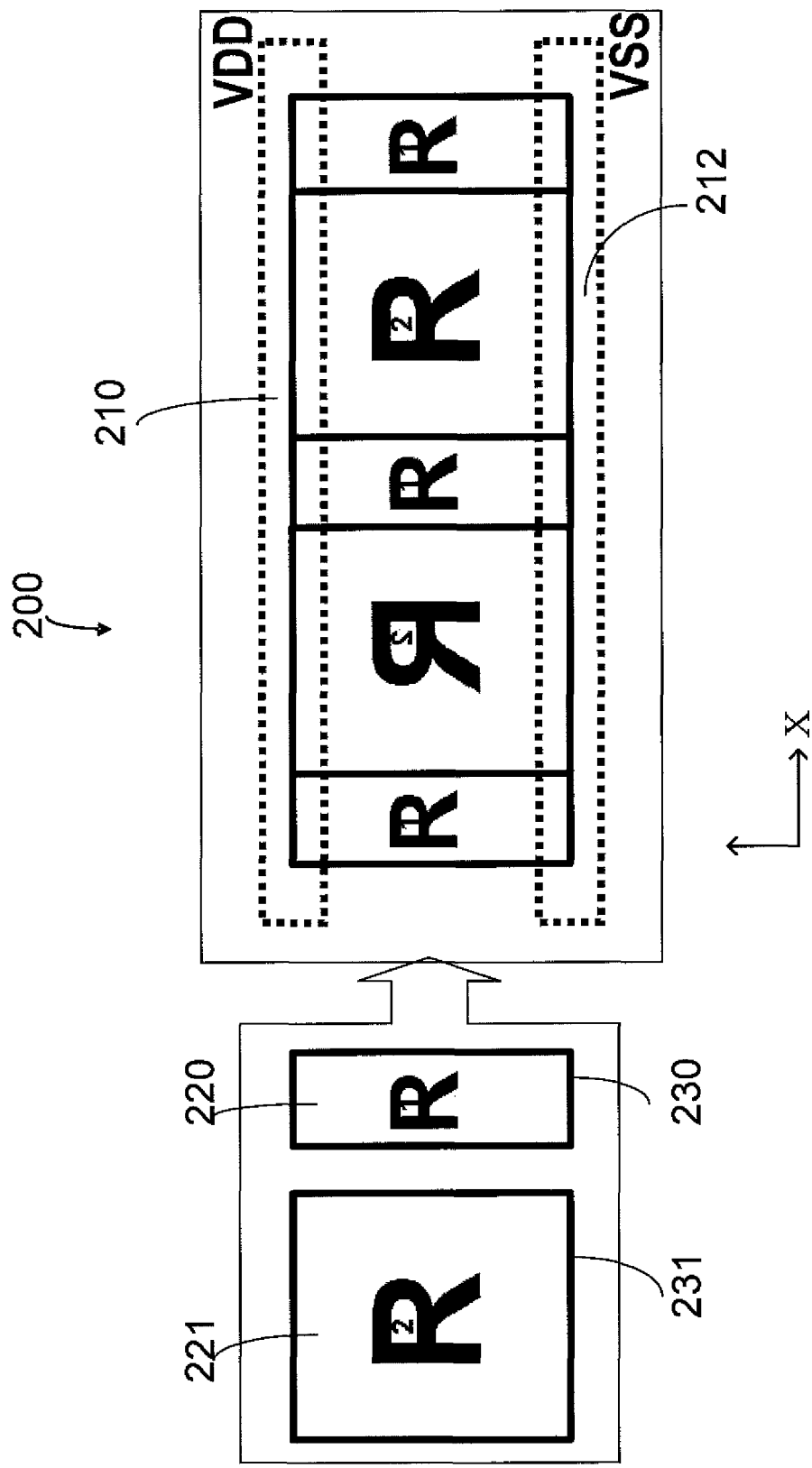
FIG. 2A shows a top view of two cells for an abutment according to an embodiment of the present invention.
FIG. 2B shows a top view of an abutment with parallel joining cells according to an embodiment of the present invention.

FIG. 2A shows a top view of two cells for an abutment according to an embodiment of the present invention, and FIG. 2B shows a top view of an abutment with parallel joining cells according to an embodiment of the present invention. Referring to FIG. 2A and FIG. 2B, an abutment 200 with parallel joining cells is illustrated with a row of cells located between a power rail 210 (VDD) and a ground rail 212 (VSS).

FIG. 2A shows original patterns of a first cell 220 and a second cell 221, wherein the first cell 220 has a boundary 230, such as a pattern of a specific layer in layout, and the second cell 221 has a boundary 231. Moreover, FIG. 2A illustrates "R" as a non-symmetrical structure. However, the first cell 220 or the second cell 221 may be a symmetrical structure or a non-symmetrical structure. In addition, a structure no matter formed from flip horizontal or flip vertical may be both different from an original structure in layout. Note that the flip horizontal described herein means to flip about an axis perpendicular to a longitudinal direction of the power rail 210/ground rail 212, and the flip vertical described herein means to flip about an axis parallel to a longitudinal direction of the power rail 210/ground rail 212. Further, in an actual structure, the first cell 220 or the second cell 221 may be any logic cell, such as INVERTER (or NOT), AND, OR, NAND, NOR, XOR, XNOR, ADDERS, FLIP-FLOP and the like, or a combination of the above logic cells or other cells with specific functions.

The row of cells as shown in FIG. 2B include the first cells 220 and the second cells 221 disposed adjacent to one another along the power rail 210 or the ground rail 212, and the power rail 210 or the ground rail 212 are parallel to an X axis. Referring to FIG. 2B again, the first cells 220 and the second cells 221 partially overlap the power rail 210 or the ground rail 212, which means a voltage may be applied between the power rail 210 and the ground rail 212 to let a circuit flow to pass through the first cells 220 and the second cells 221. In the present embodiment, a plurality of first cells 220 and a plurality of second cells 221 are alternately disposed along the X axis, which means two opposite sides of each first cell 220 connect with two second cells 221, and two opposite sides of each second cell 221 connect with two first cells 220 as well. Moreover, each first cell 220 maintains its original structure, and two second cells 221 next to the first cell 220 are reciprocal flip horizontal patterns, wherein other gap structures, for example but not limited to a dummy pattern, may exist between each two cells.

As illustrated in the prior art, the DRC violation may be occurred when the first cell 220 is next to the second cell 221, and thus the first cell 220 and the second cell 221 with different horizontal widths in the present invention are disposed next to one another in various relative positions, so as to examine where the first cell 220 next to the second cell 221 in a vertical direction is able to pass the DRC or not by the arrangement of the present embodiment.

An abutment of the present invention includes a power rail and a ground rail parallel to one another, and an area is defined therebetween. The two kinds of cells are all disposed within an area alternately without overlapping, i.e. side by side or with a gap therebetween. An original pattern of each kind of cells is defined according to an edge of the cell and may be a symmetrical structure or a non-symmetrical structure, and the sizes of the two kinds of cells may be the same or contrary. Further, in the abutment where the two kinds of cells are all disposed within an area, each of the two kinds of cells partially overlaps the power rail and the ground rail. In addition, the first kind cells are disposed within the abutment with the original patterns thereof, and the second kind cells are flipped about an axis perpendicular to a longitudinal direction of the power/ground rail, i.e. the second kind cells within the area are alternative patterns with an original pattern being a base pattern and a flip pattern.

Figures 3A, 3B, 3C, 3D:
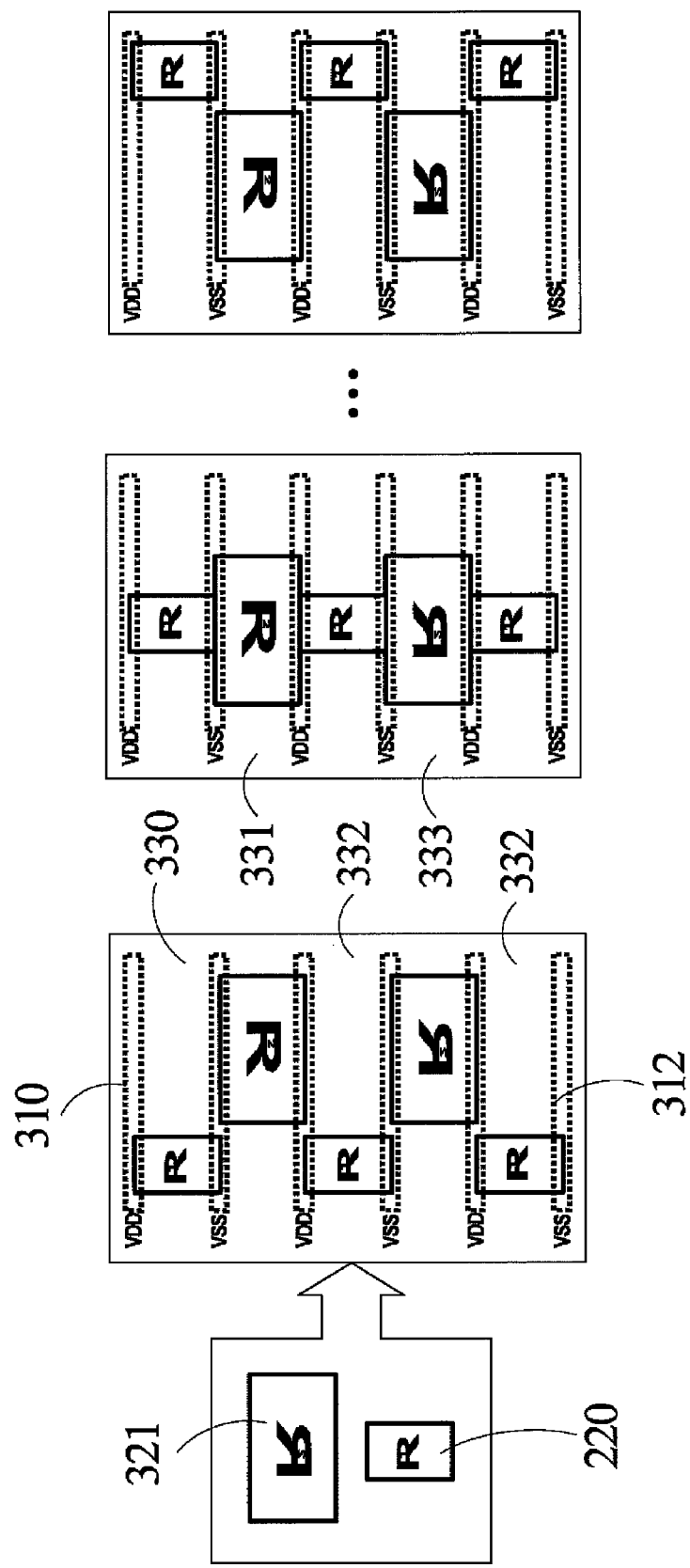
FIG. 3A shows a top view of two cells according to another embodiment of the present invention.
FIG. 3B shows a top view of an abutment with cells arranged in an array according to another embodiment of the present invention.
FIG. 3C shows a top view of an abutment with cells arranged in an array according to another embodiment of the present invention.
FIG. 3D shows a top view of an abutment with cells arranged in an array according to another embodiment of the present invention.

FIG. 3A shows a top view of two cells according to another embodiment of the present invention, FIG. 3B shows a top view of an abutment with cells arranged in an array according to another embodiment of the present invention. Referring to FIG. 3A, the first cells 220 and the second cells 321 in the present embodiment are arranged in an array, wherein the second cells 321 are the flip vertical patterns of the original patterns of the second cells 221, i.e. the first cells 220 and the second cells 321 in the layout are respectively arranged vertically.

Referring to FIG. 3B, the abutment 300 with cells arranged in an array comprises a plurality of power rails 310 and a plurality of ground rails 312 alternate with one another, and each area between neighbor two of the power rails 310 and the ground rails 312 is disposed with one first cell 220 or one second cell 321 only. In the present embodiment, each of the areas 330, 332, 334 is disposed with one first cell 220 only, and each of the areas 331, 333 is disposed with one second cell 321 only. In addition, the first cells 220 disposed within the areas 330, 332, 334 are all original patterns, but the second cells 321 disposed within the areas 331, 333 are flip horizontal patterns to one another. Moreover, as shown in FIG. 3B and FIG. 3D, the first cells 220 and the second cells 321 are arranged along the vertical direction and misaligned a width of a cell (along the X axis). When the different cells are disposed on the abutment, it is acceptable to dispose the cells next to one another incompletely (completely in general), and dispose a fixed gap (the fixed gap is an interval value) between two cells as well, and thus it is able to inspect that the various relative positions of the different cell libraries is able to pass the DRC or not by using the method provided in the present embodiment. However, as shown in FIG. 3C, the first cells 220 and the second cells 321 are arranged along the vertical direction with aligning the centers thereof.

An abutment of the present invention includes a power rail and a ground rail parallel to one another, and an area is defined therebetween. When disposed within two adjacent areas respectively, i.e. three areas separated by two power rails and two ground rails arranged alternately, the two kinds of cells may be alternately arranged along the vertical direction and misaligned a width of a cell, or arranged along the vertical direction with aligning the centers thereof. Further, in the abutment where the two kinds of cells are all disposed within an area, each of the two kinds of cells partially overlaps the power rail and the ground rail. In addition, the first kind cells are still disposed within the abutment with the original patterns thereof, and the second kind cells are disposed within the areas with alternative patterns, wherein the alternative patterns are formed from flipping the second kind cells about an axis parallel to a longitudinal direction of the power/ground rail to form first flip patterns as base patterns first, and then continuously flipping the base patterns about an axis perpendicular to a longitudinal direction of the power/ground rail. In another word, the second kind cells are disposed within the alternate areas respectively with a base pattern and an alternative pattern, and the first kind cells are respectively disposed therebetween.

As illustrated in the prior art, the DRC violation may be occurred when the first cell 220 is next to the second cell 221, and thus the first cell 220 and the second cell 221 with different horizontal widths in the present invention are respectively disposed in the areas 330, 331, 332, 333, 334 next to one another vertically, so as to examine where the first cell 220 next to the second cell 221 in a horizontal direction is able to pass the DRC or not by the arrangement of the present embodiment.

Accordingly, various abutments may be generated from such patterns to satisfy the standard cell libraries. For example, if the standard cell libraries have 846 different kinds of cells, 358281 kinds of abutments may be generated almost to satisfy all variations. Further, the abutments may all pass the DRC.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An abutment structure, comprising:
a plurality of power rails;
a plurality of ground rails, disposed parallel to said power rails and alternating with said power rails, wherein an area being defined between any one of said power rails and one of said ground rails adjacent thereto;
a plurality of first cells, a portion of each of said first cells overlapping one of said power rails and one of said ground rails adjacent thereto, and another portion thereof located within one of said areas located between one of said power rails and one of said ground rails overlapped by said another portion, wherein each of said first cells having an original pattern; and
a plurality of second cells, located within two of said areas adjacent to one of said areas disposed with said first cells, wherein each of said second cells having an original pattern, a base pattern being a flip pattern of said original pattern and a alternative pattern being a flip pattern of said base pattern, wherein some of said base patterns of said second cells being disposed to one of said areas that said second cells located within, and said alternative patterns of said second cells being disposed to the other one of said areas that said second cells located within.

2. The abutment structure as claimed in claim 1, wherein a relationship between a location of any one of said first cells and locations of said second cells located within said areas adjacent to said first cell comprises translation.

3. The abutment structure as claimed in claim 2, wherein a width of a gap between adjacent two of said first cells comprises equal to a width of said second cells.

4. The abutment structure as claimed in claim 1, wherein a relationship between a location of any one of said first cells and locations of said second cells located within said areas adjacent to said first cell comprises center-alignment.

5. The abutment structure as claimed in claim 1, wherein each of said base patterns of said second cells comprises formed from each of said original patterns of said second cells flipping about a flip axis parallel to a longitudinal direction of any one of said power rails.

6. The abutment structure as claimed in claim 1, wherein each of said alternative patterns of said second cells comprises formed from each of said base patterns of said second cells flipping about a flip axis perpendicular to a longitudinal direction of any one of said power rails.

* * * * *